United States Patent [19]

Toth et al.

[11] Patent Number: 4,467,278

[45] Date of Patent: Aug. 21, 1984

[54] MICROWAVE OVEN LEAK DETECTOR

[76] Inventors: Emery K. Toth, 26241 Hidden Valley, Farmington Hills, Mich. 48018; Lawrence E. Egbert, 1950 S. Winn Rd., Mt. Pleasant, Mich. 48858

[21] Appl. No.: 296,998

[22] Filed: Aug. 27, 1981

[51] Int. Cl.³ ...................... G01R 23/04; G01R 25/02
[52] U.S. Cl. ..................................... 324/95; 324/106; 340/600; 343/703; 374/162
[58] Field of Search .................. 324/95, 106; 340/600; 343/703; 455/67; 219/10.55 D, 10.55 E; 374/162

[56] References Cited

U.S. PATENT DOCUMENTS

| | | | |
|---|---|---|---|
| 3,693,084 | 9/1972 | Augustine | 324/95 |
| 3,696,675 | 10/1972 | Gilmour | 374/162 |
| 4,051,435 | 9/1977 | Fanslow | 324/106 |
| 4,065,655 | 12/1977 | Wong et al. | 219/10.55 D |
| 4,272,765 | 6/1981 | White | 340/600 |

*Primary Examiner*—Stewart J. Levy
*Attorney, Agent, or Firm*—Charles W. Chandler

[57] ABSTRACT

A liquid crystal film pack for detecting leakage from a microwave oven by passing the moist film pack adjacent the joints and seams of the oven to produce a color change in the liquid crystal material in response to a microwave radiation leak.

6 Claims, 4 Drawing Figures

MICROWAVE OVEN LEAK DETECTOR

BACKGROUND OF THE INVENTION

A means and method is disclosed for detecting leakage from a microwave oven employing a liquid crystal material that has been moistened to respond to microwave radiation with a color change.

Occassionally some microwave ovens produce microwave energy leakage, for example, when they have been damaged. Such leakage normally is not readily detected by the user until after long exposure.

Other reasons causing leakage can be wear of the sealing surfaces around the door, the door hinges, and the door latches.

SUMMARY OF THE INVENTION

The broad purpose of the present invention is to provide a liquid crystal film pack that, when moistened, responds to microwave radiation with a color change.

As is well known, microwave energy creates heat in the presence of moisture. In the preferred embodiment of the invention, a strip of liquid crystal film is mounted on a strip of cardboard or paper, over an opening. A piece of blotting paper is disposed in the opening and attached to the film. When the film pack is to be used, the user moistens the blotting paper which in turn moistens the film. The film pack is then slid slowly around the various parts of a microwave oven where leakage may be present, with the blotting paper in contact with the oven and the film facing the user. Any microwave leakage causes the film temperature to increase such that the film experiences a color change.

Several color changes can be provided, for example, an amber color for indicating a low degree of leakage, a green color when a medium degree of leakage is present, and a blue color for a high level of leakage. Preferably the film pack is formed to show a leakage at about 82° F. so that it does not prematurely react to a high room temperature.

Still further objects and advantages of the invention will become readily apparent to those skilled in the art to which the invention pertains upon reference to the following detailed description.

DESCRIPTION OF THE DRAWING

The description refers to the accompanying drawing in which like reference characters refer to like parts throughout the several views, and in which.

DESCRIPTION OF THE PREFERRED EMBODIMENT

Figure 1:
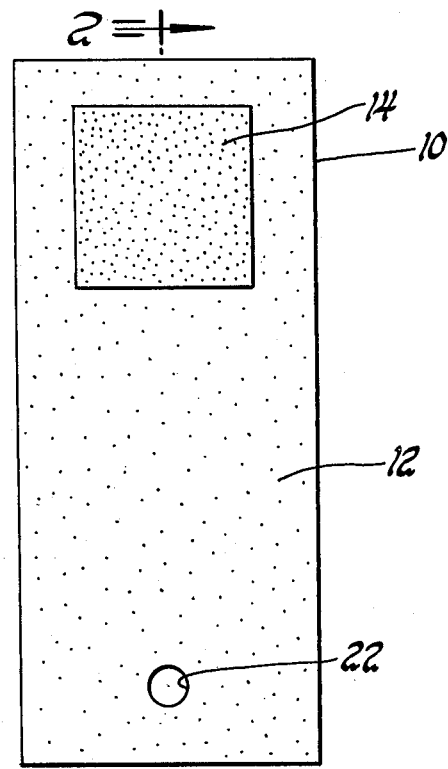
FIG. 1 illustrates the front side of the film pack embodying the invention.
Figure 2:
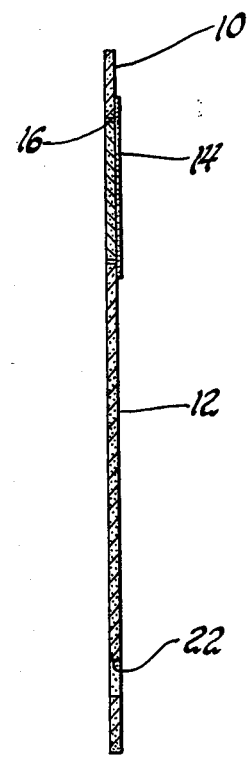
FIG. 2 is a sectional view as seen along lines 2—2 of FIG. 1.
Figure 3:
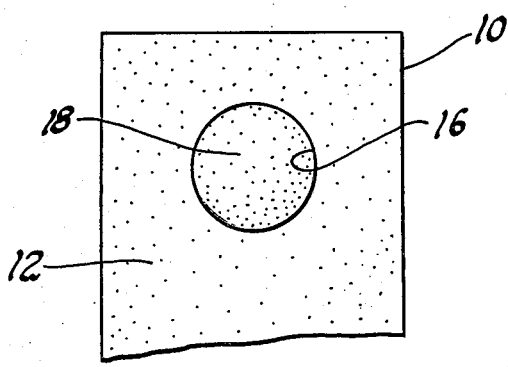
FIG. 3 is a fragmentary view of the rear of the preferred film pack.

Referring to the drawing, a preferred film pack 10 comprises a rectangular section of cardboard 12. A square section of a microencapsulated cholesteric ester liquid crystal material in the form of film 14 is mounted on one side of cardboard 12 which functions as a stiffening means. The method for making film 14 is disclosed in U.S. Pat. No. 3,861,213 which issued Jan. 21, 1975 to Robert Parker. The material is commercially available and is designed to register a color change at 20 milliwatts of leakage at an ambient room temperature of 70°–78° F. and has a recovery period of fifteen seconds. The color change is in response to a temperature of 82° F. For purposes of illustration, film 14 is normally a black color at room temperature and is adapted to change to a blue color at about 82° F.

Cardboard 12 has an opening 16 behind the film. A circular section of moisture absorbent blotting paper 18 is disposed in opening 16 and adhesively attached to the film.

An opening 22 is provided at the opposite end of the film pack for hanging the film pack from a suitable hook until it is used.

Prior to use, the user moistens the blotting paper which acts as a catalyst for the liquid crystal film. Since most ovens should not be used empty, the user places a cup of water in the cold oven. Right after turning on the oven, he checks all vents before checking the seals.

Figure 4:
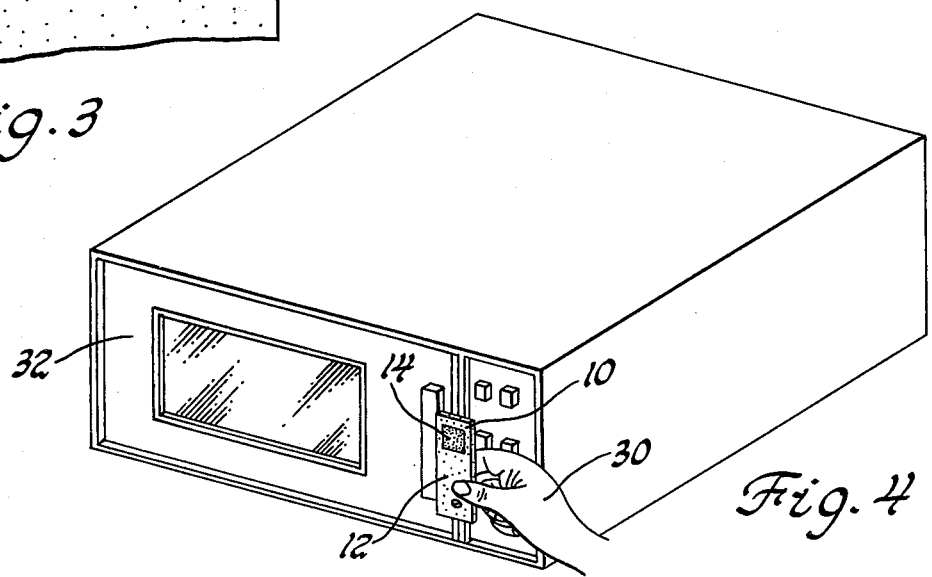
FIG. 4 illustrates the manner in which the film pack is slid along an oven seam.

The user 30 then slides the film pack along each seam of microwave oven 32, as illustrated in FIG. 4. As he slowly slides the film pack along the surface of the oven with the film facing him at a rate of about one inch per second, he can visually observe any color change in the film produced by an increase in the film temperature level.

The film can be formed to show a color change that is related to the amount of radiation, for example, amber for a low degree of radiation, green for a medium degree of radiation, and blue for a high degree of radiation. However, any color change indicates that leakage may exist and the oven should be then checked by a trained person. The user can also check other areas of possible leakage, such as around the door hinges and the door latches. The film pack is not only safe, inexpensive, and unbreakable, it is also reuseable and non-toxic.

Having described our invention, we claim:

1. Means for detecting microwave radiation leakage from a microwave oven, comprising:
    a heat responsive liquid crystal material adapted to produce a color change in response to an increase in temperature of the material; and
    first means moistened for contacting the liquid crystal material with a liquid to generate heat in the presence of microwave energy.

2. Means for detecting leakage from microwave oven as defined in claim 1, in which the liquid crystal material comprises a film of microencapsulated temperature-responsive liquid crystal material having a first color at a first temperature and adapted to change to a second color in response to an increased, second temperature.

3. Means for detecting leakage from a microwave oven as defined in claim 1, in which the second temperature is about 82° F. and the first temperature is a room temperature less than 80° F.

4. Means for detecting leakage from microwave oven as defined in claim 1, in which said means comprises a section of blotting paper engaging said liquid crystal material.

5. A method for visually detecting leakage in a microwave oven, comprising:
    moistening a moisture-absorbent material in contact with a temperature-responsive liquid crystal material of a first color;
    passing the moist moisture absorbent material adjacent the microwave oven; and
    observing the liquid crystal material change from a first color to a second color in response to heat generated in the material by exposure to microwave radiation.

6. A method as defined in claim 5, in which the material comprises a microencapsulated temperature-responsive liquid crystal material.

* * * * *